(12) United States Patent
Padmanabhan et al.

(10) Patent No.: US 6,730,969 B1
(45) Date of Patent: May 4, 2004

(54) RADIATION HARDENED MOS TRANSISTOR

(75) Inventors: Gobi R. Padmanabhan, Sunnyvale, CA (US); Visvamohan Yegnashankaran, Redwood City, CA (US); Reda Razouk, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 22 days.

(21) Appl. No.: 10/185,927

(22) Filed: Jun. 27, 2002

(51) Int. Cl.[7] .............................................. H01L 23/62
(52) U.S. Cl. ...................................................... 257/356
(58) Field of Search ................................ 257/206, 274, 257/292, 355, 356, 342, 343, 390, 401; 438/284, 286, 294

(56) References Cited

U.S. PATENT DOCUMENTS

| 5,192,989 | A | * | 3/1993 | Matsushita et al. | ......... 257/342 |
| 5,258,636 | A | * | 11/1993 | Rumennik et al. | ........... 257/339 |
| 5,668,392 | A | | 9/1997 | Huang et al. | ................ 257/340 |
| 5,751,041 | A | * | 5/1998 | Suzuki et al. | ................ 257/357 |
| 5,841,158 | A | | 11/1998 | Merrill | ......................... 257/233 |
| 5,841,176 | A | | 11/1998 | Merrill | ......................... 257/446 |
| 5,970,316 | A | | 10/1999 | Merrill | ......................... 438/57 |
| 6,063,690 | A | | 5/2000 | Woodruff et al. | ........... 438/426 |
| 6,225,178 | B1 | | 5/2001 | Shaw et al. | .................. 438/308 |
| 6,350,663 | B1 | | 2/2002 | Kopley et al. | .............. 438/448 |
| 6,388,292 | B1 | * | 5/2002 | Lin | ............................. 257/356 |
| 6,445,052 | B1 | * | 9/2002 | Lin | ............................. 257/401 |
| 6,469,354 | B1 | * | 10/2002 | Hirata | ......................... 257/358 |

* cited by examiner

*Primary Examiner*—Carl Whitehead, Jr.
*Assistant Examiner*—Jennifer M Dolan
(74) *Attorney, Agent, or Firm*—Mark C. Pickering

(57) ABSTRACT

The drain-to-source field leakage current and the device-to-device field leakage current that are caused by radiation-induced hole trapping in the field oxide region are reduced in the present invention by forming the source and drain regions a distance apart from the edge of the field oxide region.

21 Claims, 4 Drawing Sheets

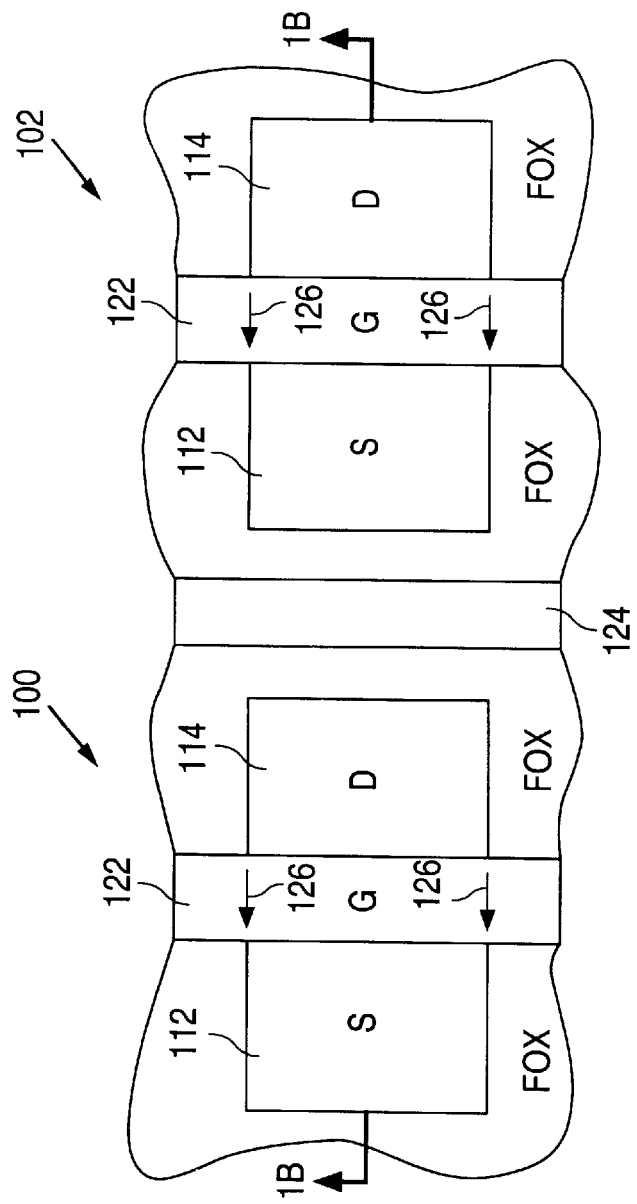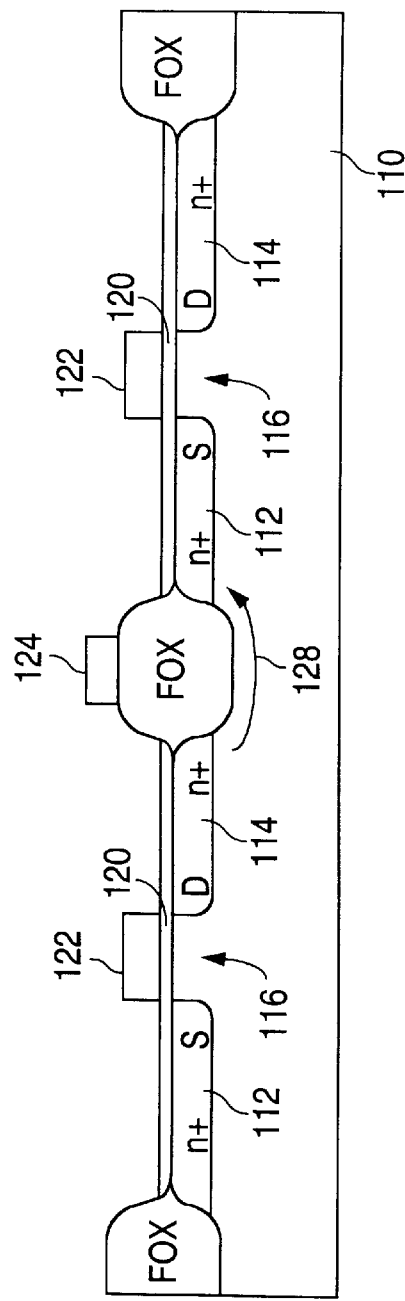
FIG. 1A
(PRIOR ART)
FIG. 1B
(PRIOR ART)

RADIATION HARDENED MOS TRANSISTOR

BACKGROUND OF THE INVENTION

1. Field of the Invention

The present invention relates to MOS transistors and, more particularly, to a radiation hardened MOS transistor.

2. Description of the Related Art

FIG. 1A shows a plan view that illustrates a prior-art NMOS transistor 100, and a prior-art NMOS transistor 102 that is formed adjacent to transistor 100. FIG. 1B shows a cross-sectional diagram taken along line 1B–1B of FIG. 1A.

As shown in FIGS. 1A and 1B, transistors 100 and 102, which are formed in a p-type substrate 110, both have spaced-apart n+ source and drain regions 112 and 114 that are formed in substrate 110. Both transistors 100 and 102 also have a channel region 116 that is located between the source and drain regions 112 and 114. The source and drain regions 112 and 114, and channel region 116 of each transistor define an active region for each transistor.

In addition, a field oxide region FOX is formed in substrate 110. Field oxide region FOX surrounds the active regions, isolating the active region of transistor 100 from the active region of transistor 102. Transistors 100 and 102 both further have a gate oxide layer 120 that is formed over channel region 116, and a gate 122 that is formed on gate oxide layer 120 over channel region 116, and on a portion of field oxide region FOX.

A local interconnect 124 can also be formed on the top surface of field oxide region FOX. This structure can form a parasitic MOS transistor where drain region 114 of transistor 100 functions as the drain, source region 112 of transistor 102 functions as the source, field oxide region FOX functions as the gate oxide layer, and interconnect 124 functions as the gate. To prevent the formation of a parasitic transistor, field oxide region FOX is formed to have a thickness that prevents the substrate region lying below field oxide region FOX from inverting when a positive voltage is applied to interconnect 124.

When ionizing radiation from outer space passes through the semiconductor materials that form transistor 100, such as silicon and oxide, the radiation causes electron-hole pairs to be formed in the semiconductor material. The electron-hole pairs formed in silicon typically recombine quickly and, as a result, pose little problem to the operation of transistor 100.

However, when the electron-hole pairs are formed in field oxide region FOX, the holes often become trapped within the oxide. The traps are widely believed to be caused by lattice defects that occur during the formation of the field oxide region FOX by the local oxidation of silicon (LOCOS) process.

With the LOCOS process, a layer of pad or buffer oxide is formed over the substrate, followed by the formation of an overlying layer of nitride. Selected portions of the layer of nitride and the underlying layer of pad oxide are then removed to expose portions of the silicon substrate where the field oxide regions are to be formed. After this, a channel-stop implant is performed, followed by the thermal growth of the field oxide regions.

As the oxide grows, however, the oxide pushes against the sides of the nitride/oxide openings. The stiffness of the nitride layer restrains the oxide from growing upward, thereby causing downward stress against the silicon along the corner of the growing oxide. Further stress along the corner is caused by the volume misfit of the growing oxide. These stresses, in turn, generate dislocations in the silicon.

Although it is difficult to characterize the exact nature of the stress-induced damage discussed above, the lattice defects are thought to trap holes. The accumulation of holes at the trap sites produces positive charges at the trap sites. The positive charges attract electrons in substrate 110 to the surface of field oxide region FOX, and can invert the region adjacent to field oxide region FOX.

When the positive charge trap sites lie at the edge of field oxide region FOX adjacent to the active region under gate 122, electrons are attracted to the surface of field oxide region FOX under gate 122. The electrons invert the surface and form a drain-to-source field edge leakage current 126 that allows electrons to flow from source region 112 to drain region 114 when no gate bias is applied. The drain-to-source field edge leakage current consumes power and can be large enough to lead to device failure.

When the positive charge trap sites lie in field oxide region FOX below interconnect 124 between drain region 114 of transistor 100 and source region 112 of transistor 102, electrons 130 are attracted to the bottom surface of field oxide region FOX. The accumulation of electrons along the bottom surface of field oxide region FOX effectively lowers the threshold voltage of the parasitic MOS transistor.

As a result, the parasitic MOS transistor can turn on, allowing a device-to-device field leakage current 128 to flow from region 114 of transistor 100 to region 112 of transistor 102, when a positive voltage is applied to interconnect 124. Thus, there is a need to increase the radiation hardness of MOS transistors.

SUMMARY OF THE INVENTION

The present invention provides a transistor that substantially increases the radiation hardness of MOS transistors by eliminating the drain-to-source field edge leakage current. The present invention also reduces the device-to-device field leakage current, which results from the lowering of the threshold voltage of a parasitic MOS transistor that utilizes the field oxide region as the gate oxide.

A transistor in accordance with the present invention is formed in a semiconductor material of a first conductivity type, and has an upper surface. The transistor includes a first region of a second conductivity type that is formed in the semiconductor material, and a second region of the second conductivity type that is formed in the semiconductor material a distance apart from the first region.

The transistor also includes a first channel region of the semiconductor material that is located between the first region and the second region. The transistor further includes a third region of the second conductivity type that is formed in the semiconductor material a distance apart from the first region and the second region.

In addition, the transistor includes a second channel region of the semiconductor material that is located between the second region and the third region. An active region is defined by the first region, the second region, the third region, the first channel region, and the second channel region.

The transistor additionally include a fourth region of the second conductivity type that is formed in the semiconductor material a distance apart from the active region. The fourth region has an upper surface that surrounds the upper surface of the active region. The transistor further includes a third channel region of the semiconductor material that is located between the fourth region and the active region.

In addition, the transistor includes a gap region of the semiconductor material that has an upper surface that adjoins the upper surface of the fourth region. The transistor further includes a field oxide region that is formed in the semiconductor material. The field oxide region surrounds the upper surface of the fourth region, and adjoins the gap region.

In addition, a gate is formed over the first channel region, the second channel region, and the third channel region. The transistor can further include a second gate that is formed over a portion of the gap region. Alternately, the upper surface of the gap region can adjoin and surround all of the fourth region, and the gate can also be formed over all of the gap region. Further, the upper surface of the gap region can adjoin and surround all of the fourth region, a first gate can be formed over the first, second, and third channel regions, and a second gate can be formed over a portion of the gap region.

A better understanding of the features and advantages of the present invention will be obtained by reference to the following detailed description and accompanying drawings that set forth an illustrative embodiment in which the principles of the invention are utilized.

BRIEF DESCRIPTION OF THE DRAWINGS

FIG. 1A is a plan view illustrating a prior-art NMOS transistor 100, and a prior-art NMOS transistor 102 that is formed adjacent to transistor 100. FIG. 1B is a cross-sectional diagram taken along line 1B—1B of FIG. 1A.

DETAILED DESCRIPTION

Figure 2A:
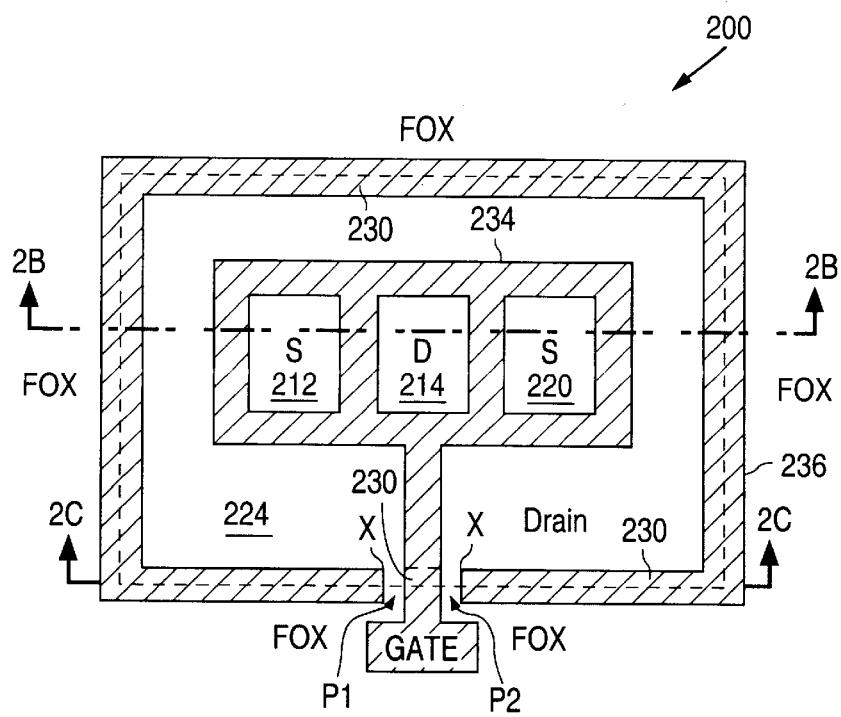
FIG. 2A is a plan view illustrating a MOS transistor 200 in accordance with the present invention.
Figure 2B:
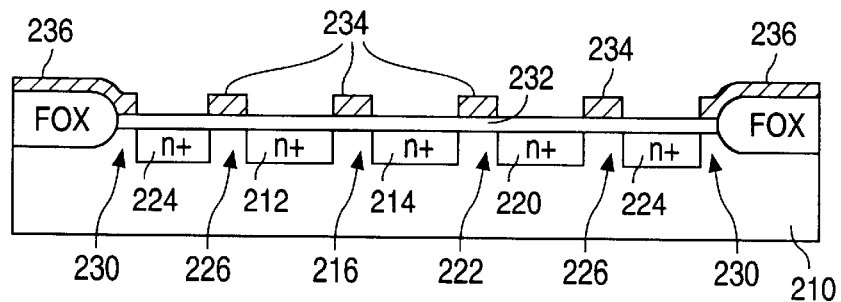
FIG. 2B is a cross-sectional view taken along line 2B—2B of FIG. 2A.
Figure 2C:
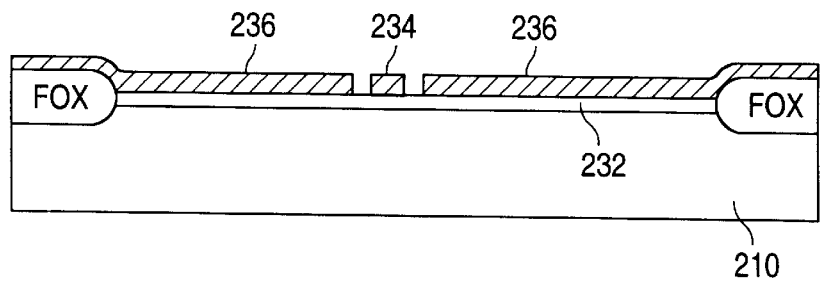
FIG. 2C is a cross-sectional view taken along line 2C—2C of FIG. 2A.

FIG. 2A shows a plan view of a MOS transistor 200 in accordance with the present invention. FIG. 2B shows a cross-sectional view taken along line 2B—2B of FIG. 2A. FIG. 2C is a cross-sectional view taken along line 2C—2C of FIG. 2A. As shown in FIGS. 2A–2C, transistor 200, which is formed in a p-type substrate 210, has spaced-apart n+ source and drain regions 212 and 214 that are formed in p-substrate 210, and a channel region 216 that is located between source and drain regions 212 and 214.

In addition, transistor 200 has an n+ source region 220 that is formed in p-substrate 210 spaced apart from regions 212 and 214, and a channel region 222 that is located between region 214 and region 220. Further, transistor 200 has an n+ drain region 224 that is formed around the n+ regions 212, 214, and 220, and spaced apart from the n+ regions 212, 214, and 220. Transistor 200 also has a channel region 226 that is located between n+ region 224 and the n+ regions 212, 214, and 220, and channel regions 216 and 222.

N+ drain region 224 is surrounded, and isolated from adjacent devices, by a field oxide region FOX that is formed in substrate 210. Further, a gap region 230 of substrate 210 is located between n+ drain region 224 and field oxide region FOX. As shown in FIG. 2A, the upper surface of gap region 230 adjoins and surrounds the upper surface of drain region 224 with two breaks in gap region 230 at points P1 and P2 where n+ drain region 224 contacts the field edge.

Transistor 200 also includes a gate oxide layer 232 that is formed on channel regions 216, 222, and 226, drain region 224, and gap region 230. Further, a gate 234 is formed on gate oxide layer 232 over channel regions 216, 222, and 226, drain region 226, gap region 230, and field oxide region FOX. In addition, transistor 200 includes a bias gate 236 that is formed on gate oxide layer 232 over gap region 230, and field oxide region FOX around n+ drain region 224. Bias gate 236, in turn, has an opening X that allows gate 234 to pass through.

In operation, transistor 200 can be connected in a number of different ways. As one example, source regions 212 and 220 and bias gate 236 can be connected to ground, and drain regions 214 and 224 can be connected to a positive voltage, such as 1.2V. Further, gate 234 can be connected to a voltage that varies from ground to, for example, the positive voltage.

In this example, current flows from drain region 214 to source region 212 and source region 220, and from drain region 224 to source regions 212 and 220. The transistor formed by source region 212 and drain region 214, and the transistor formed by source region 220 and drain region 214 have no field edge and, therefore, have no drain-to-source field edge leakage current and no device-to-device field leakage current.

In addition, the transistor formed by drain region 224 and source region 212, and the transistor formed by drain region 224 and source region 220 have no drain-to-source field edge leakage current, and only a small device-to-device field leakage current. The transistors formed by drain region 224 and source regions 212 and 220 have two small sources of device-to-device field leakage current.

The first source of device-to-device field leakage current results from the parasitic transistor that can be formed at points P1 and P2. In this case, a parasitic transistor can be formed where gate 234 functions as the gate, and the field oxide region FOX underlying gate 234 functions as the gate oxide layer.

In addition, drain region 224 at points P1 and P2 where the drain contacts the field edge functions as the drain, and the n+ region of an adjacent device functions as the source. Thus, a device-to-device field leakage current can develop if the holes trapped near points P1 and P2 sufficiently reduce the threshold voltage of the parasitic transistor.

The second source of device-to-device field leakage current is closely related to the first source. When ground is placed on gate 234, gap region 230 underlying gate 234 isolates n+ drain region 224 from the field edge. On the other hand, when a positive voltage is applied to gate 234, electrons are attracted to the surface of gap region 230 under gate 234, thereby effectively placing n+ drain region 224 in contact with the field edge under gate 234.

In this case, a parasitic transistor can be formed where gate 234 functions as the gate, and the field oxide region FOX underlying gate 234 functions as the gate oxide layer. In addition, drain region 224 under gate 234 when positively biased functions as the drain, and the n+ region of an adjacent device functions as the source. Thus, a device-to-device field leakage current can develop if the holes trapped under gate 234 sufficiently reduce the threshold voltage of the parasitic transistor.

However, since opening X is small with respect to the periphery of bias gate 236, the amount of device-to-device field leakage current is very small. Thus, since transistor 200 has no drain-to-source field edge leakage current, and only a small device-to-device field leakage current in opening X that is associated with drain region 224, transistor 200 has substantially less radiation-induced field leakage current than prior art transistor 100.

Figure 3A:
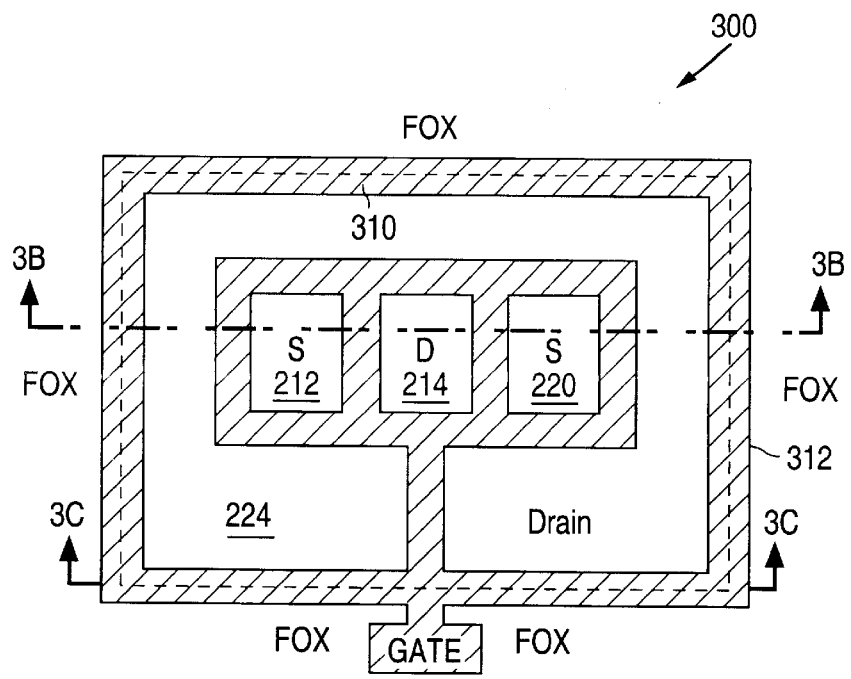
FIG. 3A is a plan view illustrating a MOS transistor 300 in accordance with an alternate embodiment of the present invention.
Figure 3B:
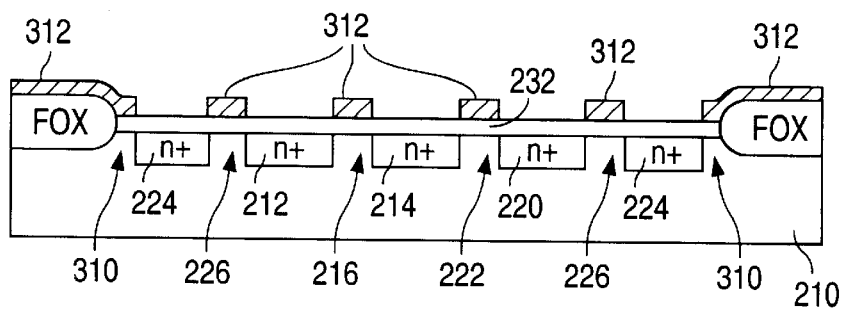
FIG. 3B is a cross-sectional view taken along line 3B—3B of FIG. 3A.
Figure 3C:
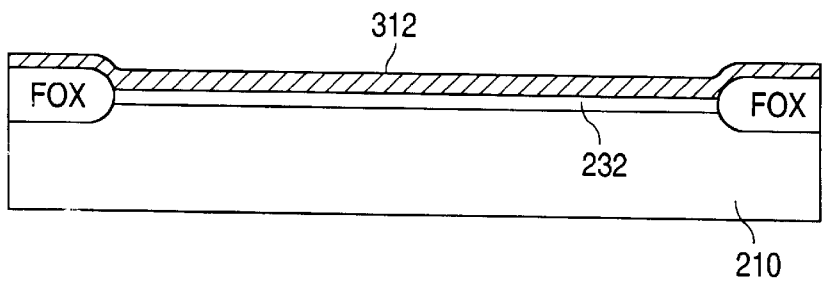
FIG. 3C is a cross-sectional view taken along line 3C—3C of FIG. 3A.

FIG. 3A shows a plan view that illustrates a MOS transistor 300 in accordance with an alternate embodiment of the present invention. FIG. 3B is a cross-sectional view taken along line 3B—3B of FIG. 3A. FIG. 3C is a cross-sectional view taken along line 3C—3C of FIG. 3A. Transistor 300 is similar to transistor 200 and, as a result, utilizes the same reference numerals to designate the structures which are common to both transistors.

Transistor 300 differs from transistor 200 in that transistor 300 has a gap region 310 that adjoins and surrounds n+ drain region 224 without any breaks in gap region 310. In addition, transistor 300 differs from transistor 200 in that transistor 300 has a gate 312 that is formed over the channel regions 216, 222, and 226, a portion of drain region 224, and all of gap region 310.

Since the upper surface of gap region 310 adjoins and surrounds n+ drain region 224 without any breaks in gap region 310, when gate 312 is connected to ground, transistor 300 has no drain-to-source field edge leakage current, and no device-to-device field leakage current. However, when a positive voltage is applied to gate 312, electrons are attracted to the surface of gap region 310, effectively placing all of the periphery of drain region 224 in contact with the field edge.

Figure 4A:
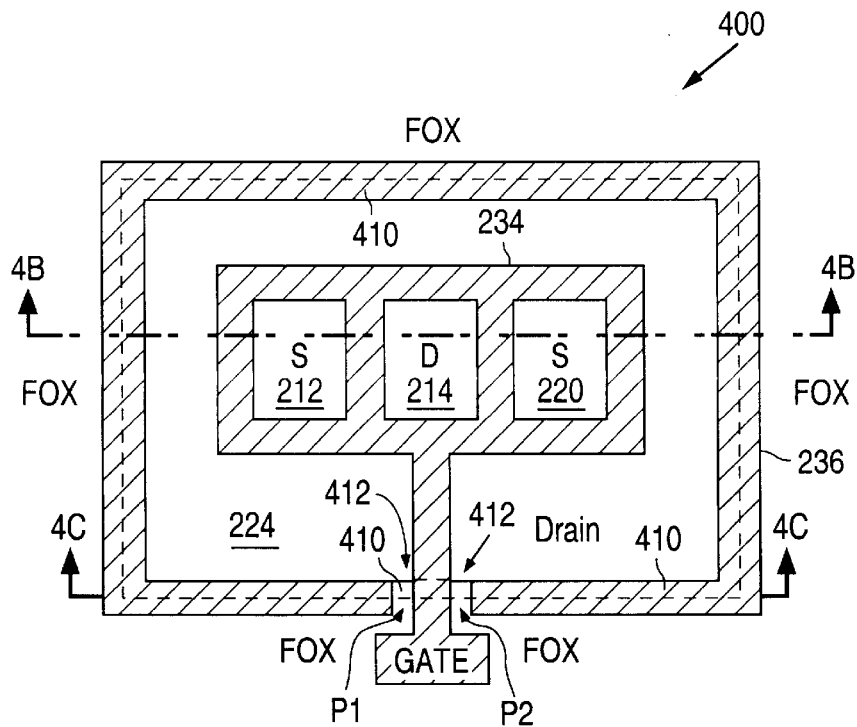
FIG. 4A is a plan view illustrating a MOS transistor 400 in accordance with an alternate embodiment of the present invention.
Figure 4B:
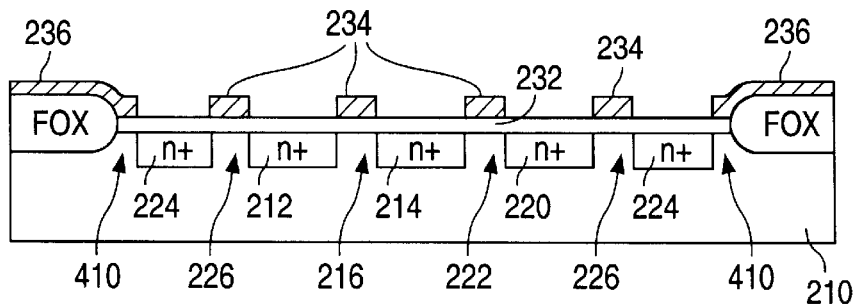
FIG. 4B is a cross-sectional view taken along line 4B—4B of FIG. 4A.
Figure 4C:
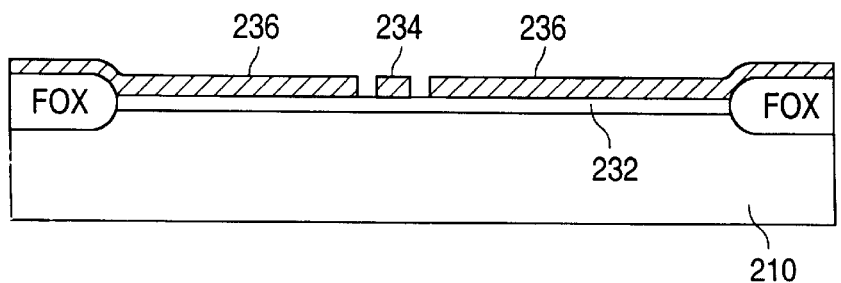
FIG. 4C is a cross-sectional view taken along line 4C—4C of FIG. 4A.

FIG. 4A shows a plan view that illustrates a MOS transistor 400 in accordance with an alternate embodiment of the present invention. FIG. 4B is a cross-sectional view taken along line 4B—4B of FIG. 4A. FIG. 4C is a cross-sectional view taken along line 4C—4C of FIG. 4A. Transistor 400 is similar to transistor 200 and, as a result, utilizes the same reference numerals to designate the structures which are common to both transistors.

Transistor 400 differs from transistor 200 in that transistor 400 has a gap region 410 with an upper surface that adjoins and surrounds n+ drain region 224 without any breaks in gap region 410. Since the upper surface of gap region 410 adjoins and surrounds n+ drain region 224, transistor 400 shares only the second source of device-to-device field leakage current with transistor 200. Thus, transistor 400 allows even less leakage current than transistor 200.

During fabrication, a layer of polysilicon (poly) is deposited on a layer of gate oxide which, in turn, is formed on a p-type semiconductor substrate (or well). A mask is formed and patterned on the poly layer, and the exposed regions of poly are etched to form gate 234 and bias gate 236 of transistor 200, or gate 312 of transistor 300.

After this, the exposed regions of the gate oxide layer and underlying substrate are implanted with an n-type dopant to form n+ regions 212, 214, 220, and 224. Gates 234, 236, and 312 prevent dopant from being implanted in the p-regions of the substrate that underlie the gates.

Transistor 400 is fabricated using the same steps as transistor 300 except that following the formation of n+ regions 212, 214, 220, and 224, gate 312 is masked and etched to form gate 234 and bias gate 236. As shown in FIG. 4A, the second polysilicon etch leaves a small opening 412 on either side of gate 234.

Thus, in accordance with the present invention, a transistor has been described that substantially reduces the field oxide leakage current that results from radiation damage to the field oxide regions, thereby increasing the radiation hardness of the transistor. In addition, because only MOS compatible structures are utilized, the present invention is easily integrated into standard CMOS fabrication processes. Transistors 200 and 300 require no additional processing steps, while transistor 400 requires one additional masking and etching step.

It should be understood that the above description is of an example of the present invention, and that various alternatives to the embodiment of the invention described herein may be employed in practicing the invention. For example, although the operation of the present invention has been described with respect to NMOS transistors, the present invention applies equally well to PMOS transistors. Thus, it is intended that the following claims define the scope of the invention and that methods and structures within the scope of these claims and their equivalents be covered thereby.

What is claimed is:

1. A transistor formed in a semiconductor material of a first conductivity type, the semiconductor material having an upper surface and a dopant concentration, the transistor comprising:
    a first region of a second conductivity type formed in the semiconductor material, the first region having an upper surface;
    a second region of the second conductivity type formed in the semiconductor material a distance apart from the first region, the second region having an upper surface;
    a first channel region of the semiconductor material located between the first region and the second region, the first channel region having an upper surface;
    a third region of the second conductivity type formed in the semiconductor material a distance apart from the first region and the second region, the third region having an upper surface;
    a second channel region of the semiconductor material located between the second region and the third region, the second channel region having an upper surface, an active region being defined by the first region, the second region, the third region, the first channel region, and the second channel region, the active region having an upper surface;
    a fourth region of the second conductivity type formed in the semiconductor material a distance apart from the active region, the fourth region having an upper surface that surrounds the upper surface of the active region;
    a third channel region of the semiconductor material located between the fourth region and the active region;
    a gap region of the semiconductor material, the gap region having an upper surface, the upper surface of the gap region adjoining the upper surface of the fourth region;
    a field oxide region formed in the semiconductor material, the field oxide region surrounding the upper surface of the fourth region, being spaced apart from the fourth region, and adjoining the gap region;
    a first gate formed over the first channel region, the second channel region, and the third channel region, the first gate having an extension section; and
    a second gate formed over the gap region, the second gate having ends, the extension section of the first gate extending out between the ends of the second gate.

2. The transistor of claim 1 wherein the upper surface of the first region is surrounded by the upper surface of a region of the semiconductor material.

3. The transistor of claim 2 wherein the upper surface of the second region is surrounded by a region of the upper surface of the semiconductor material.

4. The transistor of claim 3 wherein the upper surface of the third region is surrounded by a region of the upper surface of the semiconductor material.

5. The transistor of claim 1 wherein the first gate is formed over a portion of the fourth region.

6. The transistor of claim 1 wherein the upper surface of the gap region that adjoins the fourth region has ends and a dopant concentration that is substantially equal to the dopant concentration of the semiconductor material, and nearly surrounds the upper surface of the fourth region, a portion of the fourth region extending between the ends of the upper surface of the gap region.

7. The transistor of claim 6 wherein the upper surface of the gap region adjoins and surrounds all of the upper surface of the fourth region.

8. The transistor of claim 6 wherein the extension section of the first gate lies between the ends of the upper surface of the gap region.

9. A transistor formed in a semiconductor material of a first conductivity type, the semiconductor material having an upper surface, the transistor comprising:
    a first region of a second conductivity type formed in the semiconductor material, the first region having an upper surface;
    a second region of the second conductivity type formed in the semiconductor material a distance apart from the first region, the second region having an upper surface;
    a first channel region of the semiconductor material located between the first region and the second region, the first channel region having an upper surface;
    a third region of the second conductivity type formed in the semiconductor material a distance apart from the first region and the second region, the third region having an upper surface;
    a second channel region of the semiconductor material located between the second region and the third region, the second channel region having an upper surface, an active region being defined by the first region, the second region, the third region, the first channel region, and the second channel region, the active region having an upper surface;
    a fourth region of the second conductivity type formed in the semiconductor material a distance apart from the active region, the fourth region having an upper surface that surrounds the upper surface of the active region;
    a third channel region of the semiconductor material located between the fourth region and the active region;
    a gap region of the semiconductor material, the gap region having an upper surface, the upper surface of the gap region adjoining the upper surface of the fourth region;
    a field oxide region formed in the semiconductor material, the field oxide region surrounding the upper surface of the fourth region, being spaced apart from the fourth region, and adjoining the gap region;
    a first gate formed over the first channel region, the second channel region, and the third channel region, the first gate having a first side and a second side; and
    a second gate formed over the gap region, the first side of the first gate being separated from the second gate by a fifth region, the second side of the first gate being separated from the second gate by a sixth region, the fourth region contacting the field oxide region in the fifth and sixth regions.

10. The transistor of claim 9 wherein the first gate is formed over a portion of the fourth region.

11. A transistor formed in a semiconductor material of a first conductivity type, the semiconductor material having an upper surface, the transistor comprising:
    a first region of a second conductivity type formed in the semiconductor material, the first region having an upper surface;
    a second region of the second conductivity type formed in the semiconductor material a distance apart from the first region, the second region having an upper surface;
    a first channel region of the semiconductor material located between the first region and the second region, the first channel region having an upper surface;
    a third region of the second conductivity type formed in the semiconductor material a distance apart from the first region and the second region, the third region having an upper surface;
    a second channel region of the semiconductor material located between the second region and the third region, the second channel region having an upper surface, an active region being defined by the first region, the second region, the third region, the first channel region, and the second channel region, the active region having an upper surface;
    a fourth region of the second conductivity type formed in the semiconductor material a distance apart from the active region, the fourth region having an upper surface that surrounds the upper surface of the active region;
    a third channel region of the semiconductor material located between the fourth region and the active region;
    a gap region of the semiconductor material, the gap region having an upper surface, the upper surface of the gap region adjoining the upper surface of the fourth region, the upper surface of the gap region adjoining and surrounding all of the upper surface of the fourth region;
    a field oxide region formed in the semiconductor material, the field oxide region surrounding the upper surface of the fourth region, being spaced apart from the fourth region, and adjoining the gap region; and
    a gate formed over the first channel region, the second channel region, the third channel region, and the gap region.

12. The transistor of claim 11 wherein the first gate is formed over a portion of the fourth region.

13. A transistor formed in a semiconductor material of a first conductivity type, the semiconductor material having an upper surface and a dopant concentration, the transistor comprising:
    a plurality of spaced apart first doped regions of a second conductivity type formed in the semiconductor material;
    a plurality of first channel regions of the semiconductor material located between the first doped regions, an active region being defined by the plurality of first doped regions and the plurality of first channel regions;
    a second region of the second conductivity type formed in the semiconductor material a distance apart from the active region, the second region having an upper surface that surrounds an upper surface of the active region;
    a second channel region of the semiconductor material located between the second region and the active region;
    a gap region of the semiconductor material, the gap region having an upper surface, the upper surface of the gap region adjoining the upper surface of the second region;

a first gate formed over the first channel regions, and the second channel region, the first gate having an extension section; and a second gate formed over the gap region, the second gate having ends, the extension section of the first gate extending out between the ends of the second gate.

14. The transistor of claim 13 wherein:

the upper surface of the gap region that contacts the second region has a dopant concentration that is substantially equal to the dopant concentration of the semiconductor material, and nearly surrounds the upper surface of the second region; and the upper surface of the gap region includes ends, and a portion of the second region extends between the ends of the upper surface of the gap region.

15. The transistor of claim 14 wherein the upper surface of the gap region adjoins and surrounds all of the upper surface of the second region.

16. The transistor of claim 13 and further including a field oxide region formed in the semiconductor material, the field oxide region surrounding the upper surface of the second region, being spaced apart from the second region, and adjoining the gap region.

17. The transistor of claim 16 wherein the second gate is formed on the field oxide region.

18. The transistor of claim 16 wherein a portion of the extension section of the first gate is formed on the field oxide region.

19. The transistor of claim 18 wherein:

the upper surface of the gap region that contacts the second region has a dopant concentration that is substantially equal to the dopant concentration of the semiconductor material, and nearly surrounds the upper surface of the second region; and the upper surface of the gap region includes ends, and a portion of the second region extends between the ends of the upper surface of the gap region.

20. The transistor of claim 19 wherein the upper surface of the gap region adjoins and surrounds all of the upper surface of the second region.

21. The transistor of claim 13 wherein the ends of the second gate contact the first gate.

\* \* \* \* \*